(12) United States Patent
Hirose et al.

(10) Patent No.: US 6,691,910 B2
(45) Date of Patent: Feb. 17, 2004

(54) METHOD OF JOINING DIFFERENT METAL MATERIALS BY FRICTION WELDING

(75) Inventors: Masahito Hirose, Hayama-machi (JP); Hiroaki Asanuma, Fujisawa (JP)

(73) Assignee: Fuji Oozx, Inc. (JP)

( * ) Notice: Subject to any disclaimer, the term of this patent is extended or adjusted under 35 U.S.C. 154(b) by 0 days.

(21) Appl. No.: 10/245,247

(22) Filed: Sep. 17, 2002

(65) Prior Publication Data
US 2003/0015570 A1 Jan. 23, 2003

Related U.S. Application Data

(62) Division of application No. 09/812,297, filed on Mar. 20, 2001.

(30) Foreign Application Priority Data

Dec. 8, 2000 (JP) .......................................... 2000-373977

(51) Int. Cl.[7] ......................... B23K 20/12; B23K 37/00; B23K 1/00; B23K 1/06
(52) U.S. Cl. ...................... 228/114.5; 228/46; 228/200; 228/114; 228/2.3
(58) Field of Search .......................... 228/112.1–114.5, 228/125, 212, 218, 2.1, 2.3, 200, 46

(56) References Cited

U.S. PATENT DOCUMENTS

| | | | | |
|---|---|---|---|---|
| 3,731,959 A | * | 5/1973 | Calton et al. | 403/271 |
| 5,064,112 A | * | 11/1991 | Isobe et al. | 228/112.1 |
| 5,111,990 A | * | 5/1992 | Thrower et al. | 228/113 |
| 5,240,167 A | * | 8/1993 | Ferte et al. | 228/114.5 |
| 6,007,923 A | * | 12/1999 | Shimizu et al. | 428/586 |

FOREIGN PATENT DOCUMENTS

| | | | |
|---|---|---|---|
| JP | 59-61584 | * | 4/1984 |
| JP | 61-261609 | * | 11/1986 |
| JP | 62-197610 | | 9/1987 |
| JP | 2-160187 | * | 6/1990 |
| JP | 2-160188 | * | 6/1990 |

OTHER PUBLICATIONS

The Welding Institute Web Site (http://www.twi.co.uk/j32k/protectedband_3/jk24.html).*

* cited by examiner

*Primary Examiner*—M. Alexandra Elve
*Assistant Examiner*—Colleen P. Cooke

(57) ABSTRACT

A rod material made of Ti alloy has a larger diameter portion at the end, which is joined with the end of material made of Ti—Al intermetallic compound, by friction welding, to form a poppet valve for an internal combustion engine. Instead of providing such larger diameter portion, the end of the material made of Ti—Al intermetallic compound may be heated to facilitate joining.

9 Claims, 4 Drawing Sheets

METHOD OF JOINING DIFFERENT METAL MATERIALS BY FRICTION WELDING

CROSS REFERENCE TO A RELATED APPLICATION

This application is a divisional of co-pending application Ser. No. 09/812,297 filed on Mar. 20, 2001, which claims priority of Japan Application No. 2000-373977 filed Dec. 8, 2000. Said priority is claimed in this application.

BACKGROUND OF THE INVENTION

The present invention relates to a method of joining different metal materials by friction welding, and especially to a method of joining a rod material made of Ti alloy with a material made of Ti—Al intermetallic compound by friction welding to make a poppet valve for an internal combustion engine.

A Ti alloy poppet valve has lower specific gravity and smaller inertial mass, and provides advantages that inputs, mileage and engine performance are increased.

Heat resistant temperature of Ti alloy is about 500° C., and it is difficult to make an exhaust valve for high-combustion temperature engines such as internal-tube direct-jetting or lean-burn engines which require high temperature strength.

To overcome the disadvantage, a Ti alloy valve is disclosed in Japanese Patent Pub. No.62-197610, in which a valve head which requires high heat resistance is made of Ti-6Al-2Sn-4Zr-2Mo and a valve stem to which lower thermal load is applied is made of Ti-6Al-4V. They are joined by welding. In another method, a poppet valve is made of Ti—Al intermetallic compound.

In the former, the poppet valve which has a valve head made of high heat resistant Ti alloy provides low durability and reliability if it is used as a high speed and high load exhaust valve in which temperature of a valve head reaches to 800° C.

The poppet valve made of Ti—Al intermetallic compound has lower specific gravity than that of Ti alloy poppet valve and provides advantage for lightening the valve itself. It has high temperature strength similar to those of heat resistant steel and Ni heat resistant alloy such as Inconel, and can be used as an exhaust valve.

However, it is difficult to form it by ordinary forging, and it is required to form it by casting. Thus, the number of valve manufactured per one casting step is very small to decrease productivity and increase cost.

Furthermore, a poppet valve has a valve head at one end of a longer valve stem. In the above casting process, casting defects such as cavities are liable to occur in a smaller poppet valve. Thus, it is necessary to examine all the products by non destructive inspection using X-ray, which results in increase in cost.

The inventors made a valve head which requires high heat resistance, from Ti—Al intermetallic compound by casting to overcome casting defects, and a valve stem from Ti alloy such as Ti-6Al-4V, and joined the valve head with the valve stem.

However, between Ti—Al intermetallic compound of the valve head and Ti alloy of the valve stem, there are differences in structure and melting point. Thus, sufficient joining strength cannot be achieved by welding such as brazing. Further, Ti is very active and liable to be oxidized at high temperature to form oxidization film at welded boundaries to cause rupture.

To solve the disadvantages, the valve head is joined to the valve stem by friction welding. In ordinary friction welding, Ti—Al intermetallic compound is higher in high temperature strength than Ti alloy. Therefore, Ti alloy is plastically deformed prior to deformation of intermetallic compound and joining cannot be suitably attained.

SUMMARY OF THE INVENTION

In view of the disadvantages, it is an object to provide a method of joining different metal materials made of Ti alloy and Ti—Al intermetallic compound by friction welding to increase tensile strength.

According to one aspect of the present invention, there is provided a method of joining different metal materials by friction welding, comprising the steps of: holding a first material made of Ti alloy by a rotating chuck of a friction welding machine, said first material having a smaller diameter portion and a larger diameter portion at an end; holding a second material made of Ti—Al intermetallic compound by a stationary chuck of the friction welding machine, the smaller diameter portion of the first material being substantially equal in diameter to an end of the second material; pressing the end of the second material into the larger diameter portion at the end of the first material; rotating the first material in the rotating chuck at high speed; and stopping rotation of the first material to join the end of the second material the end of in the first material firmly.

According to another aspect of the present invention, there is provided a method of joining different metal materials by friction welding, comprising the steps of: providing a first material made of Ti alloy and a second material made of Ti—Al intermetallic compound; heating an end of the second material; and joining an end of the first material with the end of the second material by friction welding.

BRIEF DESCRIPTION OF THE DRAWINGS

The features and advantages of the invention will become more apparent from the following description with respect to embodiments as shown in the appended drawings wherein.

DETAILED DESCRIPTION OF PREFERRED EMBODIMENTS

Figure 1:
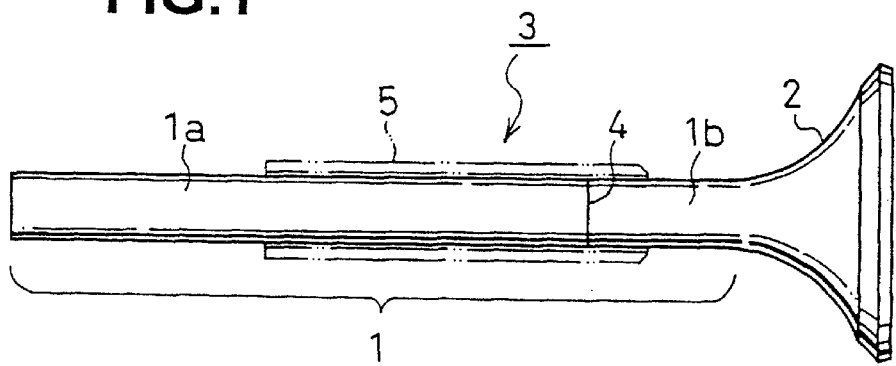
FIG. 1 is a front elevational view of a poppet valve made by a method according to the present invention.

FIG. 1 illustrates an exhaust poppet valve which consists of a valve stem 1 and a valve head 2, obtained by a method according to the present invention.

The valve stem 1 comprises a longer stem portion 1a, and a shorter stem portion 1b which is integrally formed with the valve head 2. The stem portions 1a and 1b are joined at each end by friction welding. When the valve 1 is mounted in an internal combustion engine, a joined portion 4 is always placed in the lower portion of a valve guide 5 shown by two-dotted lines so that it may not be subjected to a high temperature exhaust gas when the valve is opened.

The longer stem portion 1a is made of α-β alloy such as Ti-6Al-4V, Ti-6Al-2Sn-4Zr-6Mo and Ti-6Al-6V-2Sn formed by hot forging at less than β transformation point. The shorter stem portion 1b and the valve head 2 are made of TiAl of a Ti—Al intermetallic compound integrally formed by precision investment casting. 64.4Ti-33.5Al-0.5Cr-1.0Nb-0.5Si may be used, in which the numerals denote % by weight.

Figure 2:
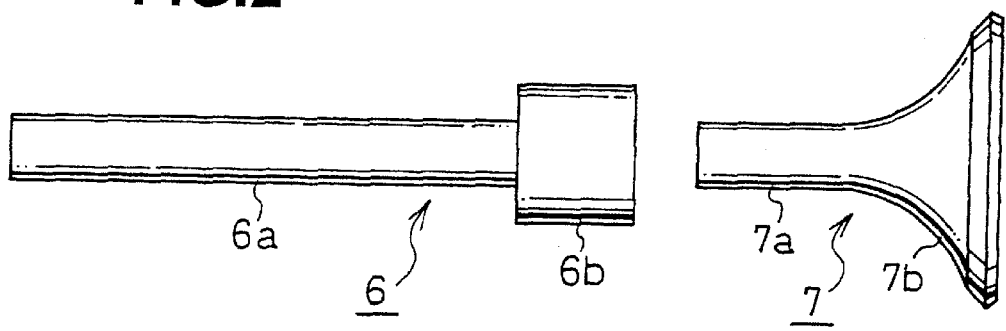
FIG. 2 is a front elevational view of a poppet valve before joining in the first embodiment of the present invention.
Figure 3:
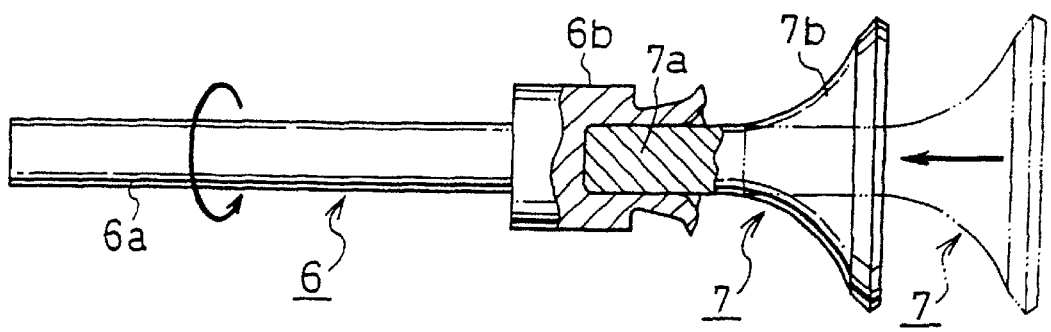
FIG. 3 is a partially sectioned front view after friction welding.
Figure 4:
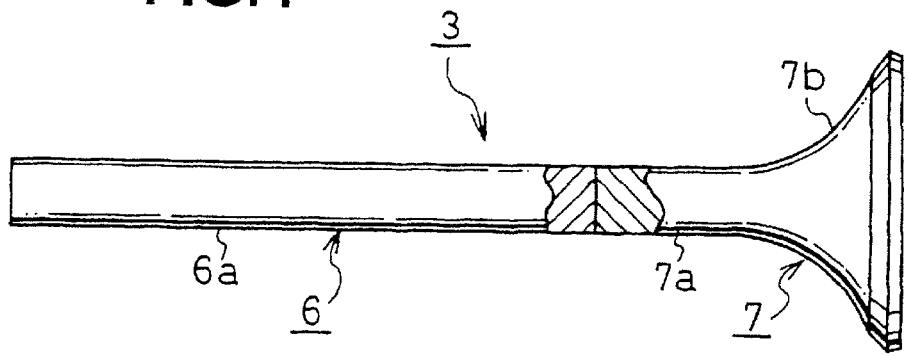
FIG. 4 is a partially sectioned front view after machining.

FIGS. 2 to 4 illustrate the first embodiment of joining the longer stem portion 1a with the shorter stem portion 1a of the valve stem 1 of the exhaust valve 3.

FIG. 2 illustrates a rod member 6 for forming the longer stem portion 1a made of α-β Ti alloy, and a head material 7 made of Ti—Al intermetallic compound before joining. A larger diameter portion 6b is formed at the end of the rod material 6. The head material 7 comprises a shorter stem portion 7a and a valve head 7b which are almost the same as the above shorter stem portion 1b and the valve head 7b, and are integrally formed by precision investment casting such that a diameter of the shorter stem portion 7a is roughly equal to a smaller diameter portion 6a of the stem material 6.

High temperature strength of Ti—Al intermetallic compound is higher than that of Ti alloy. So if Ti—Al intermetallic compound has the same shape as Ti alloy, Ti alloy is plastically deformed when both are heated, to let suitable joining impossible. It is required not to differ in high temperature strength between Ti—Al intermetallic compound and Ti alloy. To increase heat capacity at Ti alloy side, a larger diameter portion 6b is provided at the end of the rod material 6. A ratio of the shorter stem portion 7a to the larger diameter portion 6b in diameter is 1:2.2. It may be preferably from 1:2 to 1:2.5. Furthermore, the larger diameter portion 6b may be preferably cooled to about –80° C. by dry ice, and the end of the shorter stem portion 7a may be preferably heated to about 80° C. by boiling to provide difference for 160° C. in temperature for suitable joining.

Thus, when the larger diameter portion 6b is frictionally welded with the head material 7, welding temperature of the larger diameter portion 6b can be changed to be equal to that of the shorter stem portion 7a of the head material 7 to provide suitable joining.

If the diameter of a joined end of the stem material 6 is equal to that of the shorter stem portion 7a of the head material 7, the stem material 6 which has lower high-temperature strength is melted first and plastically deformed to provide incomplete joining.

To join the materials 6 and 7 as shown in FIG. 2 to each other, while the smaller diameter portion 6a of the stem material 6 is held by a rotating chuck of a known friction welding machine (not shown), the head 7b of the head material 7 is held by a stationary chuck which faces the rotating chuck coaxially so that the materials 6 and 7 may be coaxially placed.

As shown in FIG. 3, while the stem material 6 held by the rotating chuck is rotated at high speed, the head material 7 held by the stationary chuck is moved towards left and the end face of the shorter stem portion 7a is pressed on the larger diameter portion 6b of the stem material 6 at a suitable pressure. To prevent the joined portion from oxidation of Ti, an inert gas such as an Ar gas may be jetted to the joined portion.

The joined surface generates heat, and the larger diameter portion 6b which has lower high-temperature strength is melted first and deformed plastically, so that the end of the shorter stem portion 7a is put into the larger diameter portion 6b and melted therein. The rotating chuck is rapidly braked to stop rotation of the stem material 6 to join the larger diameter portion 6b with the shorter stem portion 7a of the head material 7 firmly.

Then, the joined workpiece is removed from the friction welding machine, and the joined portion thereof is cooled. The outer circumferential surface of the larger diameter portion 6b of the stem material 6 is mechanically cut to have diameter equal to the smaller diameter portion 6a and the shorter stem portion 7a of the head material 7 to provide a poppet valve in which the end faces of the stem material 6 and the shorter stem portion 7a of the head material 7 are firmly joined, or the poppet valve 3 in FIG. 1.

By such joining, the joined portion of the stem material 6 is heated to temperature over β transformation point of Ti alloy. So the organization is changed from equiaxial structure α to acicular structure, thereby increasing high-temperature strength of the joined portion of the valve stem.

Figure 5:
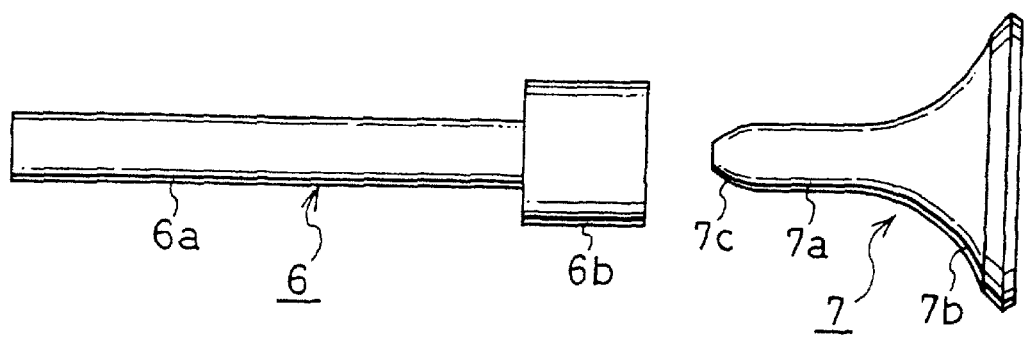
FIG. 5 is a front elevational view of the second embodiment according to the present invention before joining.
Figure 6:
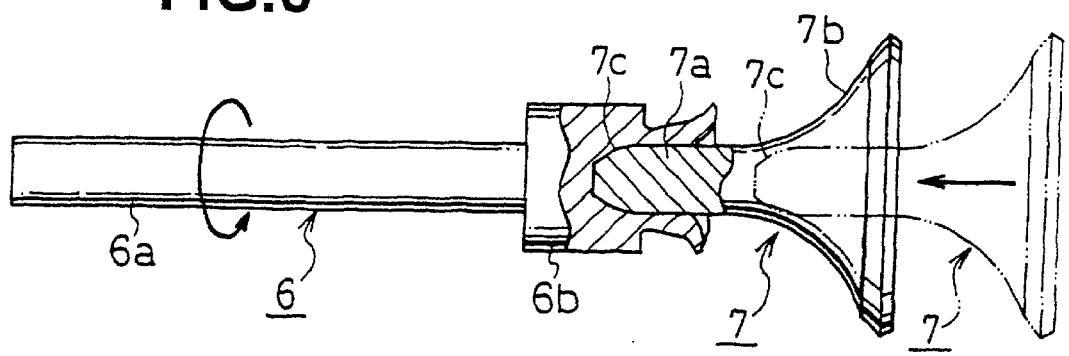
FIG. 6 is a partially sectioned front view after friction welding.
Figure 7:
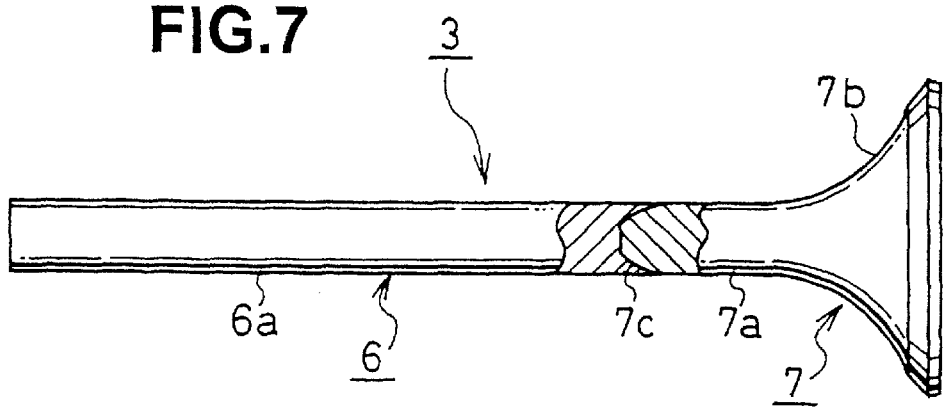
FIG. 7 is a partially sectioned front view after machining.

FIGS. 5 to 7 illustrate the second embodiment of the present invention. The second embodiment is similar to the first embodiment except the end of a shorter stem portion 7a of a head material 7, and description for friction welding and machining is omitted.

As shown in FIG. 5, the end of the shorter stem portion 7a of the head material 7 is formed as a rounded portion 7c. By such friction welding, a ratio in diameter of a larger diameter portion 6b of a stem material 6 to a smaller diameter portion 7c of a shorter stem portion 7a is larger than that in the first embodiment, and difference in mass becomes larger. Melting start temperatures of the larger diameter portion 6b and the shorter stem portion 7a become closer to each other, thereby providing better joining.

The diameter of the larger diameter portion 6b can be made to be smaller than that in the first embodiment, thereby decreasing cutting cost in machining after joining.

Furthermore, as shown in FIG. 7, a sectional area of a joined portion of the stem portion 6 with the shorter stem portion 7a of the head material 7 becomes larger than that in the first embodiment, thereby increasing joining strength significantly.

In the second embodiment, the shorter stem portion 7a may be tapered.

Figure 8:
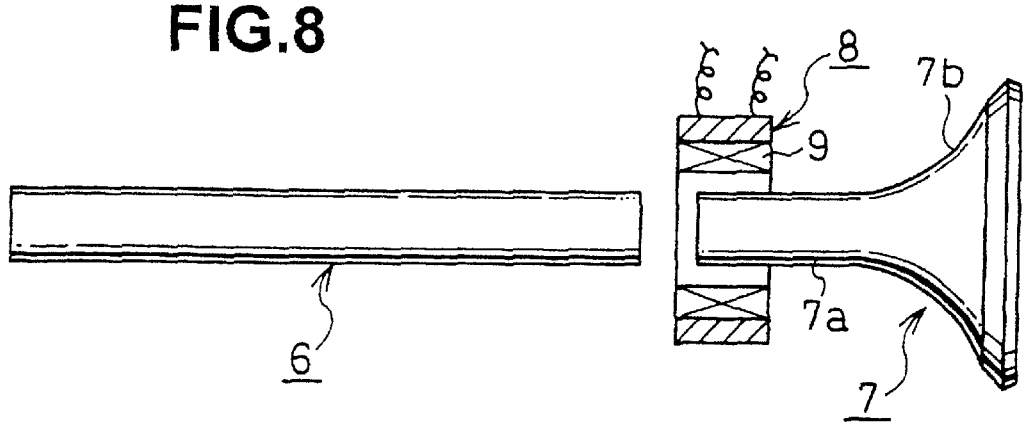
FIG. 8 is a front elevational view of the third embodiment of a poppet valve before joining.
Figure 9:
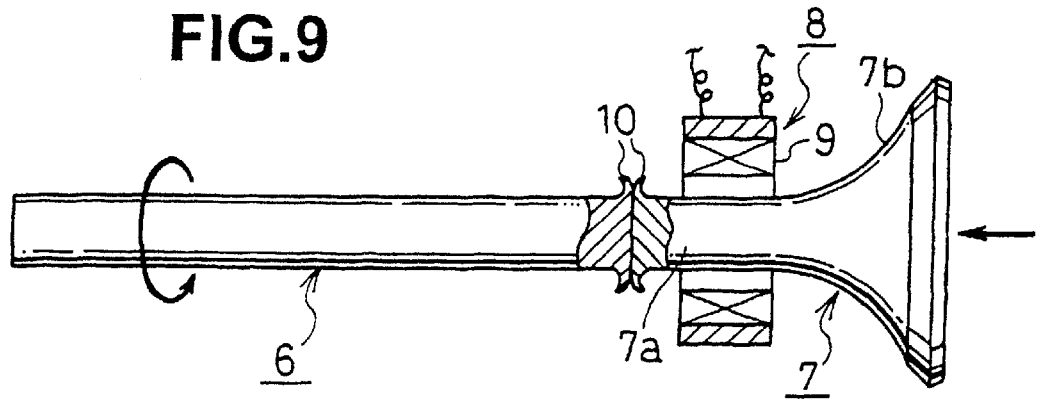
FIG. 9 is a partially sectioned front view after friction welding.

FIGS. 8 and 9 illustrate the third embodiment of a method according to the present invention. A stem material 6 has an equal diameter to a shorter stem portion 7a of a head material 7. As described above, Ti—Al intermetallic compound is higher than Ti alloy in high temperature strength, and Ti alloy is plastically deformed prior to deformation of Ti—Al intermetallic compound to let joining impossible. Not to differ strength in heating, the head material 7 is heated by a cylindrical high frequency induction heater 8 having a heating coil 9 on the inner circumferential surface. The end of the shorter stem portion 7a is inserted into a friction welding machine (not shown) to be coaxial with a chuck so that it may be heated. By such means, diameter of the stem material 6 is equal to that of the shorter stem portion 7a to allow it possible to join them.

To join the stem material 6 with the shorter stem portion 7a of the head material 7, the shorter stem portion 7a is heated by the heater 8 so that difference in temperature is 900 to and then the end face of the shorter stem portion 7a is pressed on the stem material 6 which is rotated at high speed as shown in FIG. 9. Both the end faces are similarly melted to provide firm joining. After joining, burrs 10 of a joined portion are removed by machining to provide a poppet valve similar to that in FIG. 4.

The third embodiment avoids necessity of the larger diameter portion 6b at the stem material 6, and a rod material which has equal diameter to the shorter stem portion 7a of the head material 7 can be used, thereby decreasing manufacturing cost, omitting the step for cutting the larger diameter portion 6b and increasing yield of material to allow it possible to decrease cost significantly.

In the third embodiment, the end of the shorter stem portion 7a of the head material 7 may be rounded or tapered similar to the second embodiment.

The stem material 6 may be made of Ti-6Al-4V of α-β alloy and the head material 7 may be made of TiAl or 64.5Ti-33.5Al-0.5Cr-1.0Nb-0.5Si(wherein the numerals denote % by weight.) of Ti—Al intermetallic compound by precision casting process. By the first embodiment as shown in FIGS. 2 to 4, they are joined.

Figure 10:
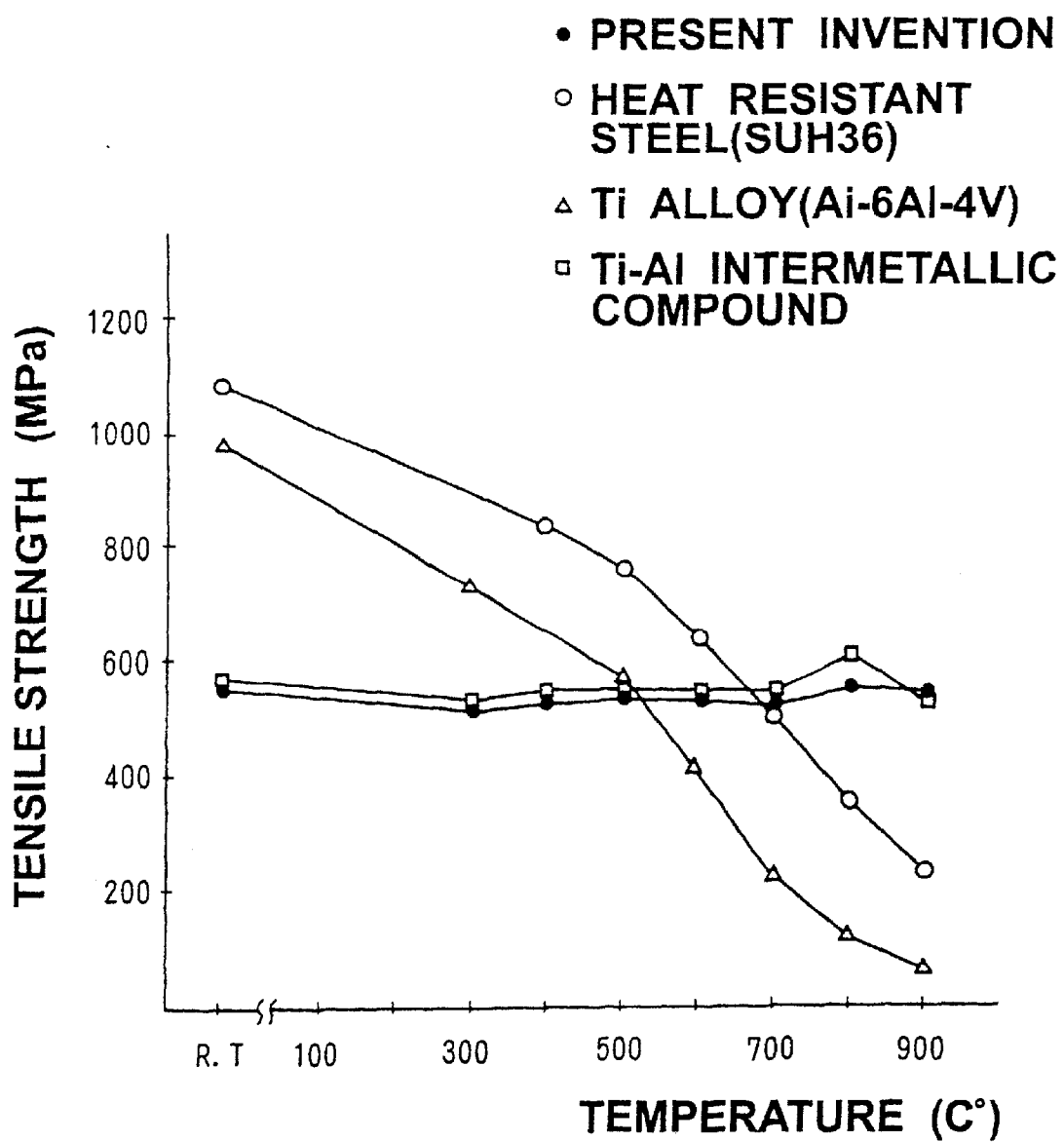
FIG. 10 is a graph which shows tensile strength to temperature of a poppet valve.

FIG. 10 illustrates tensile strength of a poppet valve thus joined by the present invention compared with those made of different materials. As shown in FIG. 10, tensile strength of heat resistant steel and Ti alloy decreases with increase in temperature, a poppet valve made by a method according to the present invention provides tensile strength which is substantially constant from room temperature to high temperature, similar to that of Ti—Al intermetallic compound, and it satisfies use as exhaust valve which requires high strength at high temperature.

The poppet valve joined by the foregoing method is lightened by about 40% of heat resistant steel and by about 11% of Ti alloy. In poppet valves joined by the second and third embodiments as above, similar results are obtained.

The method according to the present invention may be applied to joining of a turbine shaft of a turbo charger, and a heating furnace as well.

The foregoing merely relate to embodiments of the present invention. Various modifications and changes may be made by person skilled in the art without departing from the scope of claims wherein:

What is claimed is:

1. A method of joining different metal materials by friction welding, comprising the steps of:

holding a first material made of Ti alloy by a rotating chuck of a friction welding machine, said first material having a smaller diameter portion and a larger diameter portion at an end;

holding a second material made of Ti—Al intermetallic compound by a stationary chuck of the friction welding machine, the smaller diameter portion of the first material being substantially equal in diameter to an end of the second material;

pressing the end of the second material into the larger diameter portion at the end of the first material;

rotating the first material in the rotating chuck at high speed;

stopping rotation of the first material to join the end of the second material in the end of the first material firmly; and wherein the end of the first material is cooled while the end of the second material is heated to provide difference in temperature between the ends of the first and second materials for suitable joining.

2. A method as claimed in claim 1 wherein the larger diameter portion is mechanically cut after joining so that the ends of the first and second materials may be smoothly connected at the same diameter.

3. A method as claimed in claim 1 wherein an inert gas is jetted towards the ends of the first and second materials.

4. A method as claimed in claim 3 wherein the inert gas comprises an Ar gas.

5. A method as claimed in claim 1 wherein the end of the second material is rounded.

6. A method as claimed in claim 1 wherein the Ti alloy comprises Ti-6Al-4V.

7. A method as claimed in claim 1 wherein the Ti—Al intermetallic compound comprises TiAl.

8. A method as claimed in claim 2 wherein the second metal material has a valve head at an end opposite to the end to be joined, the first and second materials being joined by friction welding to form a poppet valve.

9. A method as claimed in claim 1 wherein a ratio in diameter of the end of the second material to the larger diameter portion is 1:2 to 1:2.5.

* * * * *